United States Patent
Gilderdale

Patent Number: 5,329,232
Date of Patent: Jul. 12, 1994

[54] MAGNETIC RESONANCE METHODS AND APPARATUS

[75] Inventor: David J. Gilderdale, Newton Abbot, England

[73] Assignee: Picker International, Ltd., Chelmsford, United Kingdom

[21] Appl. No.: 942,630

[22] Filed: Sep. 9, 1992

[30] Foreign Application Priority Data

Sep. 13, 1991 [GB] United Kingdom ............ 9119574

[51] Int. Cl.$^5$ ............................................. G01V 3/00
[52] U.S. Cl. .................................... 324/318; 324/309
[58] Field of Search ............... 333/227; 128/653.5; 324/300, 307, 309, 318, 322

[56] References Cited

U.S. PATENT DOCUMENTS 4,388,601 6/1983 Sneed, Jr. et al. ............... 324/318
4,733,189 3/1988 Punchard et al. ............... 324/318
5,107,216 4/1992 Yabusaki et al. ............... 324/318

FOREIGN PATENT DOCUMENTS 0167128 1/1986 European Pat. Off.
1135332 12/1968 United Kingdom.

Primary Examiner—Michael J. Tokar
Attorney, Agent, or Firm—T. B. Gurin

[57] ABSTRACT

A magnetic resonance apparatus including an r.f. coil arrangement (13) for detecting and/or exciting magnetic resonance in a body in use of the apparatus, the coil arrangement comprising a cylindrical coil (25) and two saddle coils (29) which are disposed in register on opposite sides of the cylindrical coil and conform to the surface of the cylindrical coil.

In use of the apparatus the coil arrangement is disposed with the axes of the coils lying in a plane orthogonal to the direction of a static field applied to the body.

14 Claims, 2 Drawing Sheets

MAGNETIC RESONANCE METHODS AND APPARATUS

This invention relates to magnetic resonance methods and apparatus.

More especially the invention relates to radio frequency (r.f.) coils for use in such methods and apparatus.

In magnetic resonance methods and apparatus a static magnetic field is applied to the body under investigation to define an equilibrium axis of magnetic alignment in the region of the body being examined. A radio frequency field is then applied to the region being examined in a direction orthogonal to the static magnetic field direction, to excite magnetic resonance in the region, and resulting r.f. signals are detected and processed.

The exciting r.f. field is applied and resulting signals are detected by r.f. coils placed adjacent the body. Normally separate coils are used for excitation and detection although the same coil or coils may be used for both purposes.

For some types of investigation the r.f. receiving coil is suitably of cylindrical form and adapted to fit closely around the region being examined. Such a closely fitting r.f. coil allows a high filling factor for the coil to be achieved and consequently produces detected signals having a high signal-to-noise ratio. One particular example of such an investigation is examination of the uterine cervix of a patient.

One problem which arises with such an examination is that the coil fails to detect satisfactorily signals arising from regions just outside the coil near the edges of the coil, which regions are frequently of particular interest in the case of examination of the uterine cervix.

It is an object of the present invention to provide a magnetic resonance method and apparatus including an r.f. coil arrangement which overcomes this problem.

According to a first aspect of the present invention there is provided a magnetic resonance apparatus including an r.f. coil arrangement for detecting and/or exciting magnetic resonance in a body in use of the apparatus, the coil arrangement comprising a first coil of helical form and two saddle coils conforming substantially to a surface of the first coil and disposed on opposite sides of the first coil substantially in register.

According to a second aspect of the present invention there is provided a method of examining a region of a body using magnetic resonance techniques comprising: disposing the body in a magnetic field so as to define an equilibrium axis of magnetic alignment in said region; positioning closely around said region a coil arrangement comprising a first coil of cylindrical form and two saddle coils conforming substantially to a surface of the first coil and disposed on opposite sides of said first coil substantially in register, the axes of said first coil and said saddle coils being disposed at least approximately in a plane orthogonal to the direction of said static magnetic field; and utilising said coil arrangement to excite and/or detect magnetic resonance in said region.

One magnetic resonance method and apparatus in accordance with the invention will now be described by way of example with reference to the accompanying drawings in which.

Figure 1:
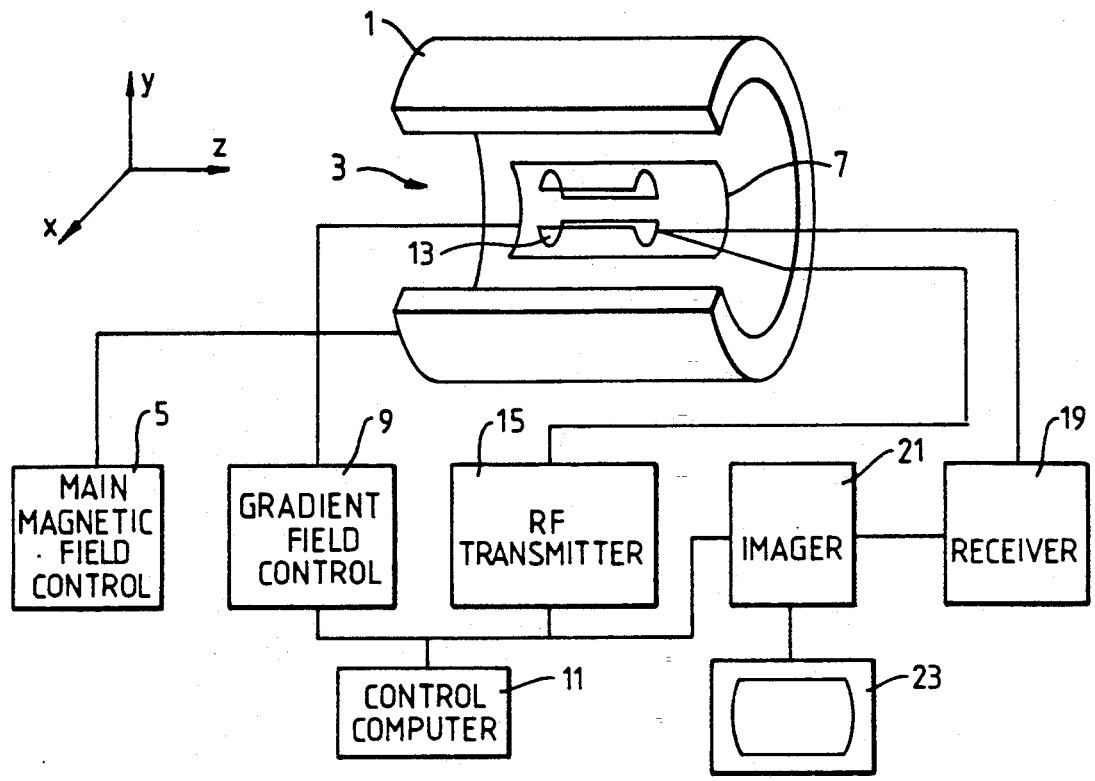
FIG. 1 is a schematic diagram of the apparatus.

Referring to FIG. 1, the apparatus, which is a magnetic resonance medical imaging apparatus, includes a tubular electromagnet 1 which produces a strong uniform static main axial magnetic field in a cylindrical volume 3 in which a patient to be imaged is placed in use of the apparatus.

The strength of the field in the volume 3, and hence in the body of the patient being imaged, is controlled by a main magnet field control means 5 which controls the supply of energising current to the electromagnet energising coil (not shown).

The apparatus further includes a gradient coil arrangement 7 whereby a gradient may be imposed on the static magnetic field in the volume 3 in any one or more of three orthogonal directions. The coil arrangement 7 is energised by a gradient field control means 9 under control of a computer 11.

The apparatus further includes an r.f. coil system 13 which includes a transmitting coil arrangement which in operation of the apparatus is energised by an r.f. transmitter 15 under control of the computer 11 to apply an r.f. field to the body being imaged.

The r.f. coil system 13 also includes an r.f. receiving coil arrangement arranged to detect r.f. signals resulting from magnetic resonance excited in the body of the patient being imaged. The detected signals are passed via a receiver 19 to an imager 21 which under control of the computer 11 processes the signals to produce signals representing an image of the patient's body. These signals are, in turn, passed to a display device 23 to provide a visual display of the image.

In operation of the apparatus the strong magnetic field provided by the electromagnet 1 defines an equilibrium axis of magnetic alignment in the body being imaged.

To obtain an image of a selected region, e.g. a cross-sectional slice of the body, an r.f. field pulse is first applied to the body by means of the coil system 13 to excite magnetic resonance in the selected region. To this end the coil system 13 produces a field in a direction orthogonal to the static field direction so as to tip the spins of nuclei in the selected region from the direction of the static field into a plane orthogonal to the static field direction i.e. into the x - y plane with x, y and z directions as depicted in FIG. 1. To restrict excitation to the selected region the r.f. field pulse is applied in conjunction with magnetic field gradients imposed by the coil arrangement 7, the frequency of the r.f. field being chosen in conjunction with the magnitudes and directions of the imposed gradients so that the Larmor frequency of chosen protons in the body, e.g. hydrogen protons, is equal to the r.f. field frequency only in the selected region.

The r.f. signals resulting from excitation are then spatially encoded by application of one or more further gradient magnetic fields in known manner, detected by the r.f. coil system 13, and processed to produce an image.

Normally a number of excitation and signal detection sequences are required to collect sufficient data to produce a satisfactory image.

Figure 2:
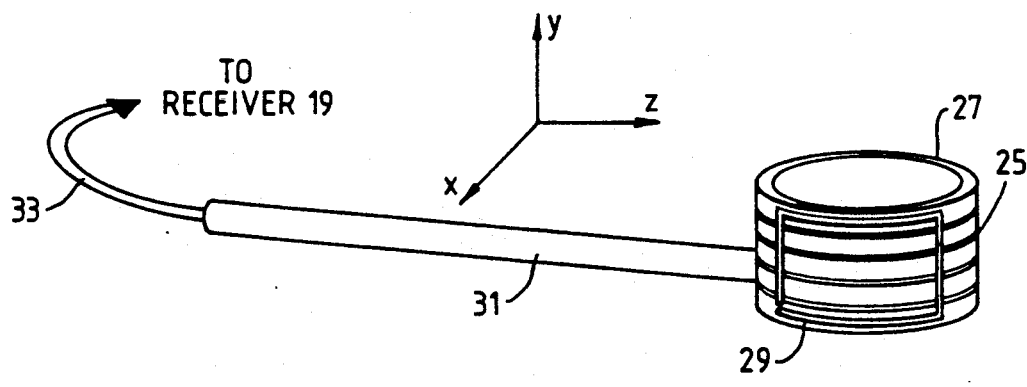
FIG. 2 is a diagrammatic perspective view of an r.f. coil arrangement of the apparatus of FIG. 1.

For examination of the uterine cervix an r.f. receiving coil arrangement as shown in FIG. 2 is used.

The arrangement comprises a cylindrical coil 25 wound on a tubular former 27. The former 27 is suitably made of a plastics material such as Delrin (Registered Trade Mark), and the coil 25 suitably consists of copper foil strip. For signals in the range 6 to 70 MHz the coil 25 typically has 1 to 5 turns, depending on operating frequency.

The arrangement further includes a pair of rectangular saddle coils 29 disposed diametrically opposite one another, in register, on the outside of the former 27, over the top of the coil 25 and electrically insulated therefrom. Each coil 29 suitably comprises a single turn made of copper foil and subtends an angle of about 127° at the axis of the former 27.

In operation the coils 29 are connected for energisation in series, in the same sense, so as to operate in the manner of a Helmholtz pair.

The former 27 is mounted at one end of a handle 31 of plastics material along which extends a cable 33 for connecting the coils 25, 29 with the receiver 19.

It will be appreciated that the former 27 is dimensioned so as to fit snugly over the cervix of a patient, and typically has a length of 2 cms and a diameter of 3.8 cms. The saddle coils 29 typically have an axial length of about 95% of the axial length of the former 27, and the coil 25 an axial length of between 10 and 95% of the axial length of the former 27, depending on the number of turns and hence the operating frequency.

The arrangement is used with the axes of the coils 25 and 29 lying at least approximately in the x - y plane, i.e. orthogonal to the direction of the static magnetic field, e.g. with the axis of the coil 25 parallel to the y-direction as illustrated in FIG. 2.

With the coil arrangement in this orientation the coil 25 does not produce signals in response to nuclear spins in the x - y plane in regions outside the coil adjacent the ends of the coil former 27. Hence, when producing an image of a rectangular z - y slice through the cervix no signals are obtained in respect of regions near the corners of the slice.

Figure 3:
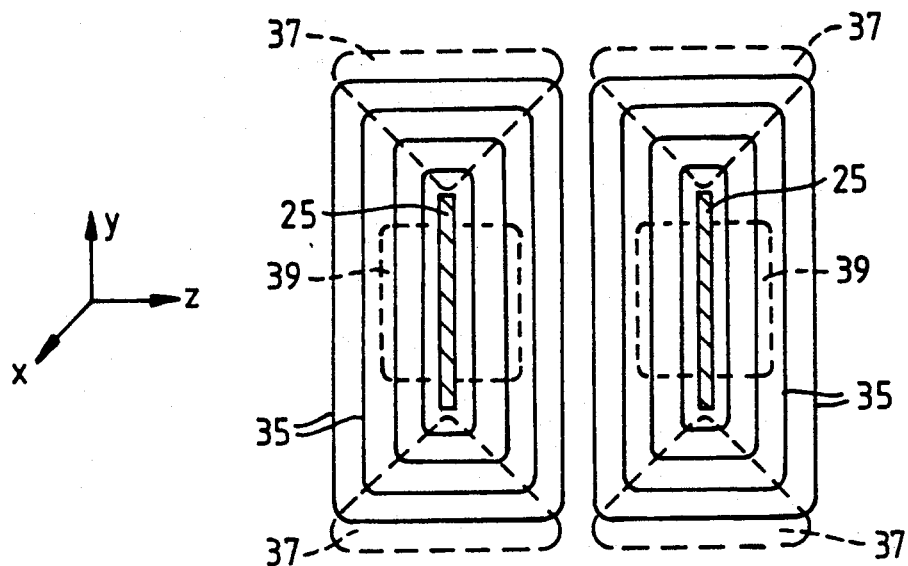
FIGS. 3 and 4 are diagrams illustrating the operation of the coil arrangement of FIG. 2.

The reason for this can be seen from a consideration of FIG. 3 which shows flux lines 35 for the magnetic field which would be produced by passing a current through the coil 25. Where the flux lines 35 lie generally in the x - y plane, by reciprocity, spins in the x - y plane will induce voltages in the coil 25. However, spins in the four regions 37 where the flux lines 35 are generally in the z-direction will not induce voltages in the coil 25.

Figure 4:
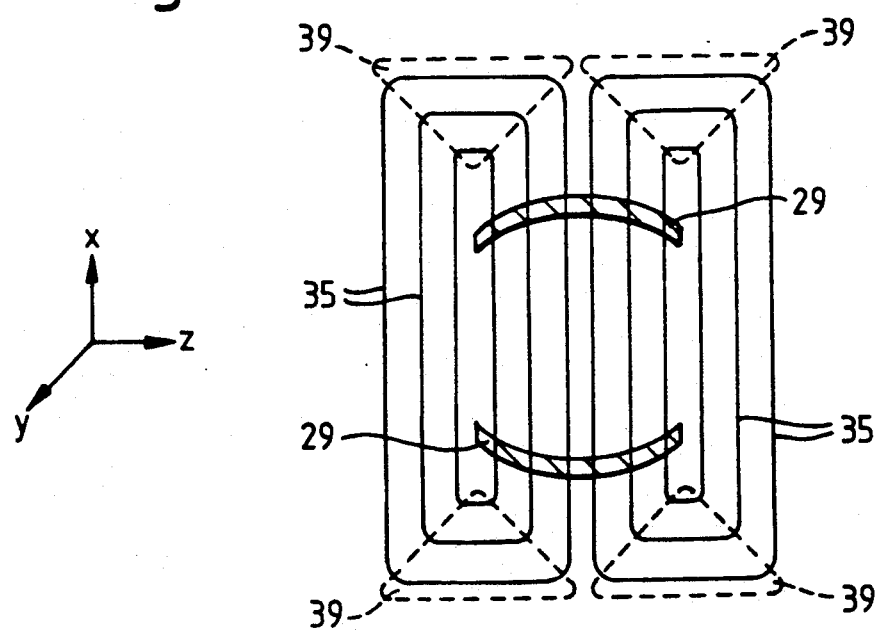

The saddle coils 29 overcome this problem by providing signals in respect of the regions 37. The coils 29 exhibit no-signal regions or blind spots for the same reason as explained above in respect of coil 25, but, as illustrated in FIGS. 3 and 4, the blind spots 39 for the coils 29 lie in the z - x plane, i.e. they do not coincide with the z - y plane blind spots 37 of the coil 25. Thus, by suitably combining the signals produced by the coil 25 and the coils 29 the blind spots are eliminated.

An additional advantage of the coil arrangement is that, since the coil 25 and coils 29 are orthogonal and can therefore be configured to minirise mutual inductive coupling, it is possible to combine the signals from the coil 25 and the coils 29 so that for regions where the flux patterns for the coil 25 and coils 29 are orthogonal, a signal-to-noise ratio gain of up to 1.4 times that for a single coil can be achieved.

It will be understood that whilst a coil arrangement according to the present invention finds particular application as an r.f. receiving coil arrangement since it is adapted to fit closely around a structure being examined, it can also be employed as an r.f. transmitting coil arrangement with similar advantages to those described above in relation to its use as an r.f. receiving coil arrangement. However, in general it is not necessary for a transmitting coil to fit closely around a region being examined.

I claim:

1. A magnetic resonance apparatus including an r.f. coil arrangement for detecting and exciting magnetic resonance in a body in use of the apparatus, the coil arrangement comprising a first coil of cylindrical form and two saddle coils conforming substantially to a surface of the first coil and disposed on opposite sides of the first coil substantially in register, said first coil and saddle coils connected to one of an r.f. receiver and an r.f. transmitter during the respective detection or excitation of magnetic resonance, said first coil and saddle coils arranged relative to each other such that magnetic resonance signal blind spots respectively associated with one of the first coil and saddle coils operating independently are eliminated.

2. An apparatus according to claim 1 wherein said saddle coils are of substantially rectangular form.

3. An apparatus according to claim 1 wherein said first coil is of substantially circular cross-section.

4. An apparatus according to claim 1 wherein said coils are carried on a tubular former.

5. An apparatus according to claim 1 wherein said saddle coils are connected so as to operate in the manner of a Helmholtz pair.

6. A method of examining a region of a body using magnetic resonance techniques comprising:
   disposing the body in a magnetic field so as to define an equilibrium axis of magnetic alignment in said region;
   positioning closely around said region a coil arrangement comprising a first coil of cylindrical form and two saddle coils conforming substantially to a surface of the first coil and disposed on opposite sides of said first coil substantially in register, the axes of said first coil and said saddle coils being disposed at least approximately in a plane orthogonal to the direction of said static magnetic field;
   arranging said first coil and saddle coils relative to each other such that magnetic resonance signal blind spots respectively associated with one of the first coil and saddle coils operating independently are eliminated;
   connecting said first coil and saddle coils to one of an r.f. receiver and an r.f. transmitter for detection or excitation respectively of magnetic resonance in said body; and
   utilizing said coil arrangement to excite and detect magnetic resonance in said region.

7. A magnetic resonance apparatus comprising an r.f. coil arrangement for use in receiving nuclear magnetic resonance signals, said coil arrangement comprising:
   a first coil of cylindrical form disposed on a former for receiving nuclear magnetic resonance signals and producing a first electrical signal indicative of said received signals, said first coil having a first blind spot through which nuclear magnetic resonance signals are not converted into the first electrical signal;
   a pair of saddle coils disposed diametrically opposite one another and substantially in register on the former for receiving nuclear magnetic resonance signals and producing a second electrical signal indicative of said received signals, said saddle coils having a second blind spot through which nuclear magnetic resonance signals are not converted into the second electrical signal;

said first coil and saddle coils arranged relative to one another such that the first and second blind spots are not coincident and the first and second blind spots are eliminated by combining the first and second electrical signals.

8. A magnetic resonance apparatus as set forth in claim 7 wherein said saddle coils are of substantially rectangular form.

9. A magnetic resonance apparatus as set forth in claim 7 wherein said first coil is of substantially circular cross-section.

10. A magnetic resonance apparatus as set forth in claim 7 wherein said saddle coils are connected so as to operate in the manner of a Helmholtz pair.

11. A magnetic resonance apparatus as set forth in claim 7 wherein said saddle coils conform substantially to the surface of the first coil.

12. A magnetic resonance apparatus as set forth in claim 7 wherein said first coil and saddle coils are electrically insulated from each other.

13. A magnetic resonance apparatus as set forth in claim 7 wherein said coil arrangement is used to transmit nuclear magnetic resonance signals.

14. A magnetic resonance apparatus as set forth in claim 7 wherein said former is tubular.

* * * * *